(12) United States Patent
Kang et al.

(10) Patent No.: US 7,459,370 B2
(45) Date of Patent: Dec. 2, 2008

(54) METHOD OF FABRICATING SEMICONDUCTOR MEMORY DEVICE HAVING PLURALITY OF STORAGE NODE ELECTRODES

(75) Inventors: Dae-hyuk Kang, Hwaseong-si (KR); Jung-min Oh, Incheon-si (KR); Chang-ki Hong, Seongnam-si (KR); Sang-jun Choi, Seoul (KR); Woo-gwan Shim, Yongin-si (KR)

(73) Assignee: Samsung Electronics Co., ltd., Suwon-si, Gyeonggi-do (KR)

( * ) Notice: Subject to any disclaimer, the term of this patent is extended or adjusted under 35 U.S.C. 154(b) by 37 days.

(21) Appl. No.: 11/546,420

(22) Filed: Oct. 12, 2006

(65) Prior Publication Data
US 2007/0082471 A1    Apr. 12, 2007

(30) Foreign Application Priority Data
Oct. 12, 2005    (KR) .................... 10-2005-0096165

(51) Int. Cl.
*H01L 21/20* (2006.01)
(52) U.S. Cl. .................. 438/381; 438/238; 438/706; 438/745; 257/E21.17; 257/E21.229; 257/E21.304; 257/E21.32; 257/E21.227; 257/E21.246; 257/E21.646
(58) Field of Classification Search ................. 438/238, 438/381, 311, 657, 675, 706, 680, 692, 745, 438/637, 733, 593, 689
See application file for complete search history.

(56) References Cited
U.S. PATENT DOCUMENTS 6,483,136 B1 * 11/2002 Yoshida et al. ............ 257/295
6,589,837 B1 * 7/2003 Ban et al. .................. 438/239
6,764,863 B2 * 7/2004 Sheu et al. ................. 438/3
6,784,068 B2 * 8/2004 Lee et al. ................... 438/396
6,855,597 B2 * 2/2005 Shin et al. .................. 438/253
6,914,286 B2 * 7/2005 Park ........................... 257/304
6,949,786 B2 * 9/2005 Miyajima ................... 257/306
7,018,892 B2 * 3/2006 Shim et al. ................. 438/254

FOREIGN PATENT DOCUMENTS

| JP | 11-026718 | 1/1999 |
|----|-----------|--------|
| KR | 1020050003003 A | 1/2005 |
| KR | 1020050057932 A | 6/2005 |

* cited by examiner

*Primary Examiner*—David Nhu
(74) *Attorney, Agent, or Firm*—Volentine & Whitt, PLLC

(57) ABSTRACT

In one aspect, a method of fabricating a semiconductor memory device is provided which includes forming a mold insulating film over first and second portions of a semiconductor substrate, where the mold insulating film includes a plurality of storage node electrode holes spaced apart over the first portion of the semiconductor substrate. The method further includes forming a plurality of storage node electrodes on inner surfaces of the storage node electrode holes, respectively, and forming a capping film which covers the storage node electrodes and a first portion of the mold insulating film located over the first portion of the semiconductor substrate, and which exposes a second portion of the mold insulating film located over the second portion of the semiconductor substrate. The method further includes selectively removing, including wet etching, the mold insulating film to expose a sidewall of at least one storage node electrode among the storage node electrodes covered by the capping film, and removing the capping film by dry etching to expose upper portions of the storage node electrodes.

38 Claims, 15 Drawing Sheets

METHOD OF FABRICATING SEMICONDUCTOR MEMORY DEVICE HAVING PLURALITY OF STORAGE NODE ELECTRODES

BACKGROUND OF THE INVENTION

1. Field of the Invention

The present invention generally relates to the fabrication of semiconductor devices, and more particularly, the present invention relates to the fabrication of semiconductor memory devices having storage node electrodes.

A claim of priority is made to Korean Patent Application No. 10-2005-0096165, filed on Oct. 12, 2005, in the Korean Intellectual Property Office, the disclosure of which is incorporated herein in its entirety by reference.

2. Description of the Related Art

Semiconductor devices, for example, dynamic random access memory (DRAM) devices, continued to become more highly integrated with increased capacity. One way in which the degree of integration is increased is by disposing larger numbers of capacitors within a small area while at the same time increasing the capacitance of each capacitor. This can be achieved, for example, by increasing the density and height of storage node electrodes of the capacitors.

For example, U.S. Pat. No. 6,855,597 by Shin, Chul-Ho, et al. discloses a DRAM cell having a cylindrical or concave storage node electrode. Dielectric layers of the DRAM cell are formed on both an inner surface and an outer surface of the storage node electrode. Thus, the area of the dielectric layers is increased, and the capacitance of a capacitor is increased. However, due to the increase in density of the DRAM cell, adjacent storage node electrodes may contact each other (known as 'bridging') when outer surfaces of the storage node electrodes are exposed. Bridging of the storage node electrodes can cause device errors.

FIG. 1 is a cross-sectional view illustrating a conventional DRAM device, and FIG. 2 is a plan view of a bottom surface of a storage node electrode of the conventional DRAM device of FIG. 1.

Referring to FIGS. 1 and 2, storage node electrodes 70 are provided on an etch stop film 65, and may be connected to a semiconductor substrate 50 using contact plugs 60 provided within an interlayer insulating film 55. Although other shapes are possible, in this example the storage node electrodes 70 are formed in the form of a rigid beam of a rectangular parallelepiped. The storage node electrodes 70 may be exposed by removing a mold insulating film (not shown) encompassing their outer surfaces. However, in removing the mold insulating film, adjacent storage node electrodes 70 may contact each other due to surface tension of a water film or a water mark 90 caused by water contained in a wet solution or provided in a washing or drying operation.

More specifically, two kinds of forces may be applied between the storage node electrodes 70. One is a surface tension ($F_s$) that works to attract the storage node electrodes 70 to each other, and the other one is an elastic force ($F_e$) that is works in a direction opposite to that of surface tension.

A bridge between the storage node electrodes 70 occurs when the surface tension ($F_s$) is greater than the elastic force ($F_e$). As shown in the following Expression 1, the probability (P) of a bridge may be obtained from the equilibrium of the surface tension ($F_s$) and the elastic force ($F_e$).

$$P \propto 2v \sin \theta (L+H) H^3 / 3EID \quad \text{(Expression 1)}$$

where, E denotes Young's modulus, I denotes the inertia momentum of a horizontal section, H denotes a height of the storage node electrodes 70, v denotes the surface tension coefficient of water, $\theta$ denotes a contact angle between the storage node electrodes 70 and the water film or the water mark 90, D denotes a separation distance between the storage node electrodes 70, and L denotes a width of the storage node electrode 70.

Accordingly, it can be seen from the proportional relationship shown in Expression 1 that the bridge probability (P) is proportional to the height (H) of the storage node electrodes 70, and is inversely proportional to the separation distance (D). However, it is generally desirable to increase the height (H) of the storage node electrodes 70 to improve the capacitance, and to decrease the separation distance (D) between the storage node electrodes 70 to increase density, both of which will result in an increase in bridge probability (P). In other words, as the DRAM device becomes more highly integrated with increased capacity, the bridge probability (P) of Expression 1 increases.

FIGS. 3 and 4 are photographic images of storage node electrodes 70 of a conventional DRAM device. Referring to these figures, bridges are observed between the storage node electrodes 70 within an encircled region A of the images. Bridging of this type can cause electrical shorts between adjacent capacitor nodes, which in turn can result in device failures.

Returning to FIG. 1, it should also be noted that the conventional method of fabricating the DRAM device may also be disadvantageous in that voids may occur by corrosion of a material under the storage node electrodes 70, for example, the contact plugs 60. The voids can occur when bottom portions of the storage node electrodes 70 are exposed to a wet solution, and are known as being caused by so-called galvanic corrosion. Like bridging, voids of this type can degrade the reliability of the DRAM device.

SUMMARY OF THE INVENTION

According to an aspect of the present invention, a method of fabricating a semiconductor memory device is provided which includes forming a mold insulating film over first and second portions of a semiconductor substrate, where the mold insulating film includes a plurality of storage node electrode holes spaced apart over the first portion of the semiconductor substrate. The method further includes forming a plurality of storage node electrodes on inner surfaces of the storage node electrode holes, respectively, and forming a capping film which covers the storage node electrodes and a first portion of the mold insulating film located over the first portion of the semiconductor substrate, and which exposes a second portion of the mold insulating film located over the second portion of the semiconductor substrate. The method further includes selectively removing, including wet etching, the mold insulating film to expose a sidewall of at least one storage node electrode among the storage node electrodes covered by the capping film, and removing the capping film by dry etching to expose upper portions of the storage node electrodes.

According to another aspect of the present invention, a method of forming a semiconductor memory device is provided which includes forming an interlayer insulating film over a semiconductor substrate in which a cell region and a peripheral region are defined, where the interlayer insulating film includes a plurality of contact plugs located over the cell region of the semiconductor substrate. The method further includes forming a mold insulating film over the interlayer insulating film, where the mold insulating film includes a plurality of storage node electrode holes which expose at least portions of the contact plugs, respectively, and forming a plurality of storage node electrodes on inner surfaces of the storage node electrode holes, respectively, where the storage node electrodes are spaced apart from each other and electrically connected to the respective contact plugs. The method further includes forming a capping film which covers the storage node electrodes and a first portion of the mold insulating film located over the cell region of the semiconductor substrate, and which exposes a second portion of the mold insulating film located over the peripheral region of the semiconductor substrate. The method further includes selectively removing, including wet etching, the mold insulating film to expose a sidewall of at least one storage node electrode among the storage node electrodes covered by the capping film, and removing the capping film by dry etching to expose upper portions of the storage node electrodes.

According to another aspect of the present invention, a method of fabricating a semiconductor memory device is provided which includes forming an interlayer insulating film over a semiconductor substrate in which a cell region and a peripheral region are defined, where the interlayer insulating film includes a plurality of contact plugs located over the cell region of the semiconductor substrate. The method further includes forming a mold insulating film over the interlayer insulating film, where the mold insulating film includes a plurality of storage node electrode holes which expose at least portions of the contact plugs, respectively, and forming a plurality of storage node electrodes on inner surfaces of the storage node electrode holes, respectively, where the storage node electrodes are spaced apart from each other and electrically connected to the respective contact plugs. The method further includes etching the mold insulating film to a depth which exposes portions of sidewalls of the storage node electrodes protruding above the etched mold insulating film, and forming a capping film which covers the storage node electrodes and a first portion of the etched mold insulating film located over the cell region of the semiconductor substrate, and which exposes a second portion of the etched mold insulating film located over the peripheral region of the semiconductor substrate. The method further includes selectively removing, including wet etching, the mold insulating film to expose a sidewall of at least one storage node electrode among the storage node electrodes covered by the capping film, and removing the capping film by dry etching to expose upper portions of the storage node electrodes.

According to another aspect of the present invention, a method of fabricating a semiconductor memory device is provided which includes forming an interlayer insulating film over a semiconductor substrate in which a cell region and a peripheral region are defined, where the interlayer insulating film includes a plurality of contact plugs located over the cell region of the semiconductor substrate. The method further includes forming a mold insulating film over the interlayer insulating film, where the mold insulating film includes a plurality of storage node electrode holes which expose at least portions of the contact plugs, respectively. The method further includes forming a plurality of storage node electrodes on inner surfaces of the storage node electrode holes, respectively, where the storage node electrodes are spaced apart from each other and electrically connected to the respective contact plugs, and forming a capping film which covers the storage node electrodes and a first portion of the mold insulating film located over the cell region of the semiconductor substrate, and which exposes a second portion of the mold insulating film located over the peripheral region of the semiconductor substrate. The method further includes forming a plurality of contact holes which penetrate the capping film and at least an upper part of the first portion of the mold insulating film, and which are located between at least some of the storage node electrodes, selectively removing, including wet etching, the mold insulating film having the contact holes formed therein to expose a sidewall of at least one storage node electrode among the storage node electrodes covered by the capping film, and removing the capping film by dry etching to expose upper portions of the storage node electrodes.

According to another aspect of the present invention, a method of fabricating a semiconductor memory device which includes forming an interlayer insulating film over a semiconductor substrate in which a cell region and a peripheral region are defined, where the interlayer insulating film includes a plurality of contact plugs located over the cell region of the semiconductor substrate, forming an etch stop film over the interlayer insulating film, the etch stop film exposing at least portions of the contact plugs, and forming a mold insulating film over the etch stop film, where the mold insulating film includes a plurality of storage node electrode holes which expose at least portions of the contact plugs, respectively. The method further includes forming a plurality of storage node electrodes on inner surfaces of the storage node electrode holes, respectively, where the storage node electrodes are spaced apart from each other and electrically connected to the respective contact plugs, and etching the mold insulating film to a depth which exposes portions of sidewalls of the storage node electrodes protruding above the etched mold insulating film. The method further includes forming a capping film which covers the storage node electrodes and a first portion of the etched mold insulating film located over the cell region of the semiconductor substrate, and which exposes a second portion of the etched mold insulating film located over the peripheral region of the semiconductor substrate. The method further includes forming a plurality of contact holes which penetrate the capping film and at least an upper part of the first portion of the mold insulating film, and which are located between at least some of the storage node electrodes, selectively removing, including wet etching, the mold insulating film having the contact holes formed therein to expose a sidewall of at least one storage node electrode among the storage node electrodes covered by the capping film, and removing the capping film by dry etching to expose upper portions of the storage node electrodes.

BRIEF DESCRIPTION OF THE DRAWINGS

The above and other features and advantages of the present invention will become readily apparent from the detail description that follows, with reference to the accompanying drawings, in which.

DETAILED DESCRIPTION OF EMBODIMENTS

Figure 1:
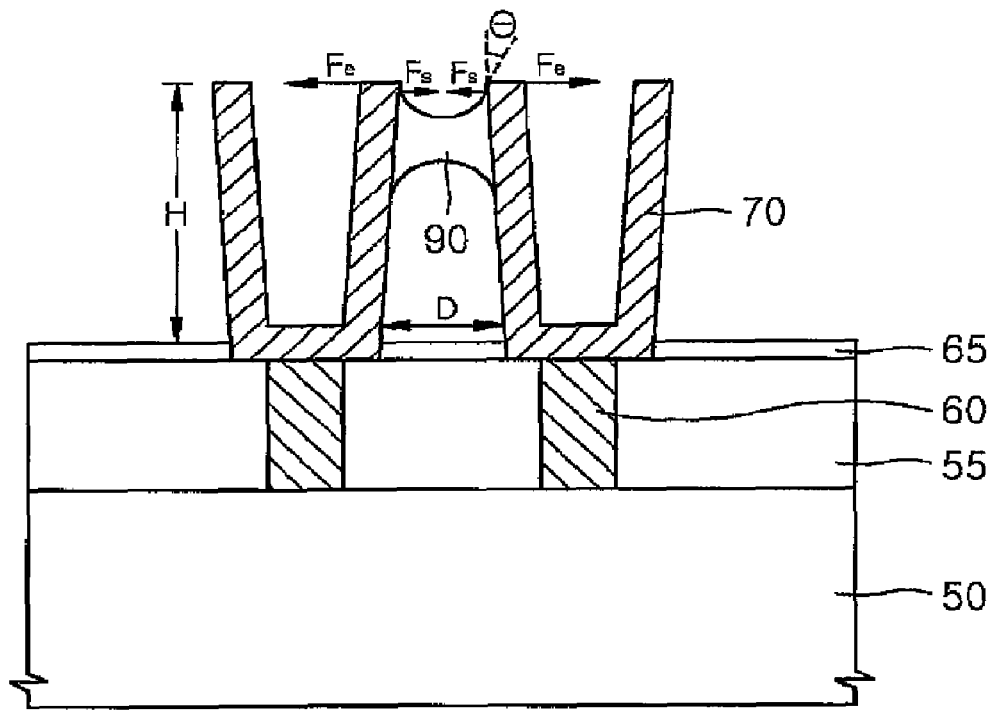
FIG. 1 is a cross-sectional view illustrating a conventional DRAM device.
Figure 2:
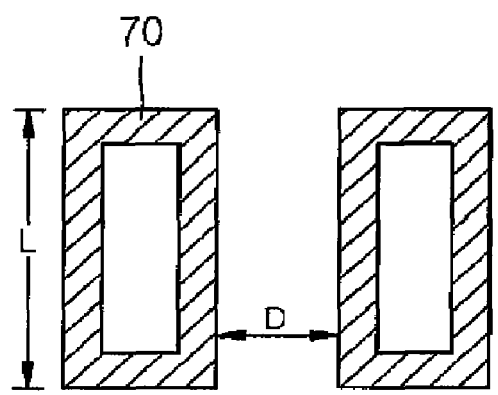
FIG. 2 is a plan view of a bottom surface of a storage node electrode of the conventional DRAM device FIG. 1.
Figure 3:
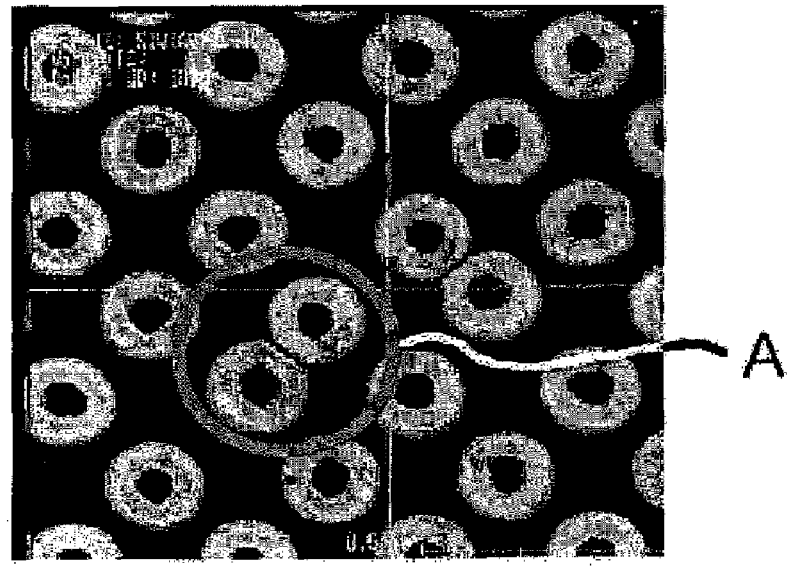
FIGS. 3 and 4 are photographic images of storage node electrodes of a conventional DRAM device.
Figure 4:
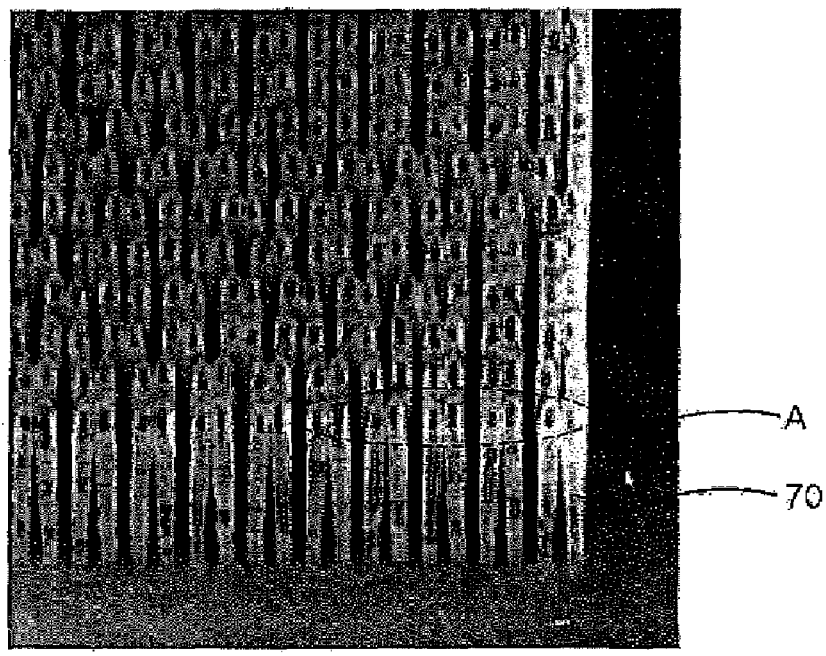

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers (or films) and regions are exaggerated for clarity.

A semiconductor memory device according to an embodiment of the present invention includes a plurality of storage node electrodes. For example, the semiconductor memory device may be a DRAM device. The DRAM device may use each of the storage node electrodes as one electrode of a capacitor. The storage node electrodes may be arranged in an array, and one or more storage node electrodes may be disposed within a unit cell.

A method of fabricating a semiconductor memory device according to an embodiment of the present invention will now be described with reference to FIGS. 5 through 18. FIGS. 5, 7, 9, 11, 13, 15 and 17 are plan views, and FIGS. 6, 8, 10, 12, 14, 16 and 18 are cross-sectional views taken along lines X-X' of FIGS. 5, 7, 9, 11, 13, 15 and 17, respectively.

Figure 5:
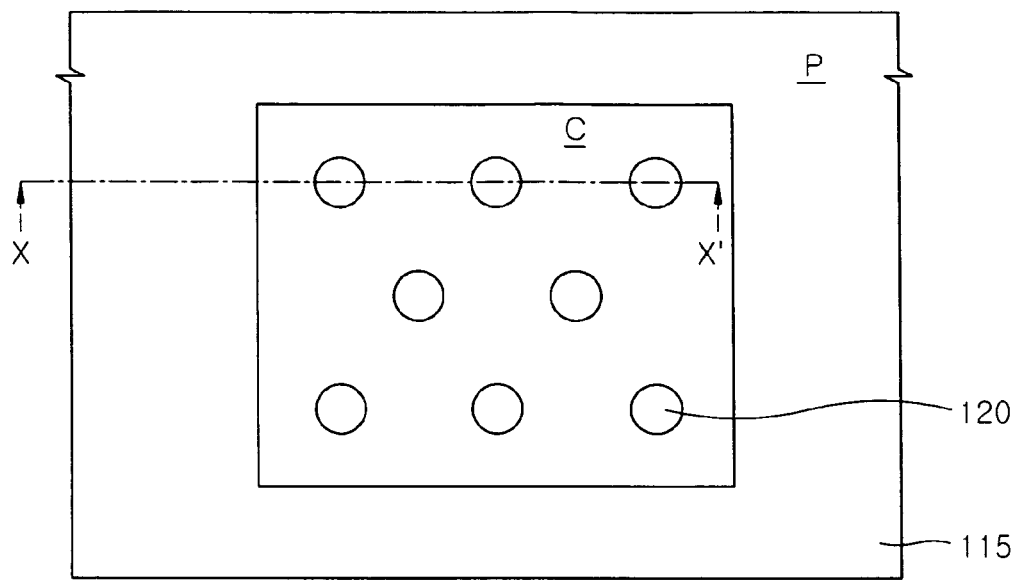
FIGS. 5 through 18 are plan views and corresponding cross sectional views for describing a method of fabricating a semiconductor memory device according to an embodiment of the present invention.
Figure 6:
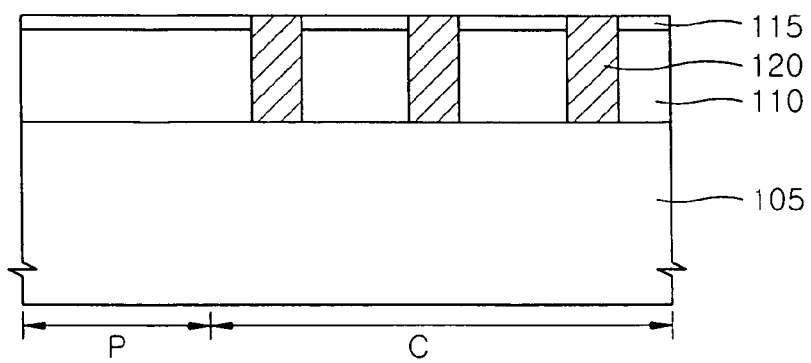
Figure 10:
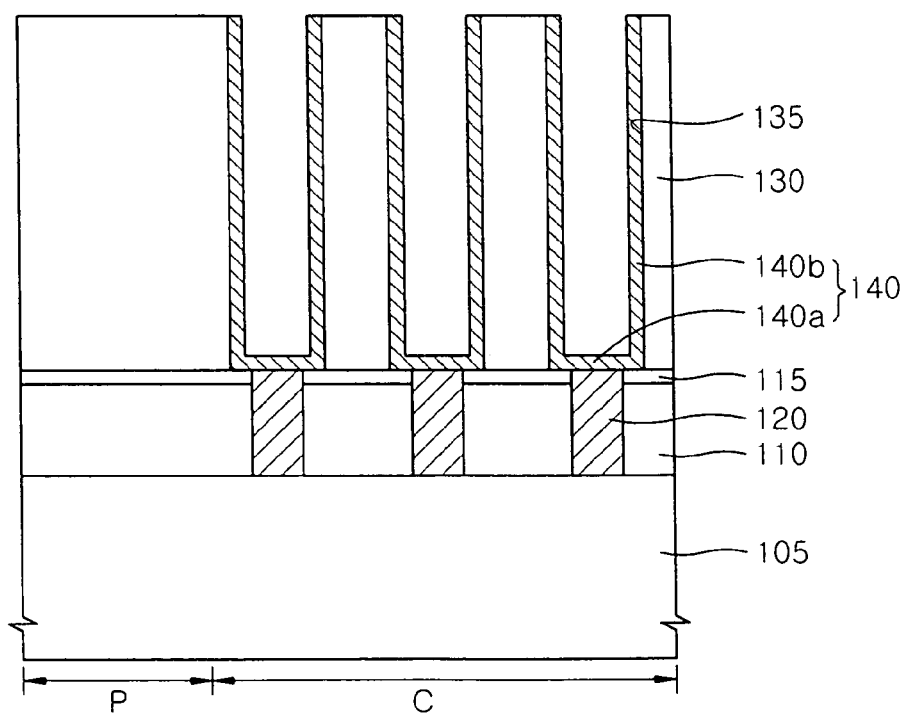

Referring to FIGS. 5 and 6, a semiconductor substrate 105 includes a cell region (C) and a peripheral region (P). The cell region (C) and the peripheral region (P) are defined by their structures, not by their names. For example, the cell region (C) may be defined as one region where storage node electrodes 140 of FIG. 10 are formed, and the peripheral region (P) may be defined as a region other than the cell region (C). In the case of a DRAM device, a capacitor is formed on the cell region (C), and an input/output device may be formed on the peripheral region (P).

The semiconductor substrate 105 may be a bulk wafer including one of silicon, germanium, and a mixture thereof, and may further include an epitaxial layer of silicon, germanium or a mixture thereof on the bulk wafer. For example, the semiconductor substrate 105 may be a silicon-on-insulator (SOI) wafer.

An interlayer insulating film 110 is formed on the semiconductor substrate 105. The interlayer insulating film 110 may include a plurality of contact plugs 120 disposed on the cell region (C). An etch stop film 115 may be further formed on the interlayer insulating film 110. The interlayer insulating film 110 may expose portions, e.g., upper portions, of the contact plugs 120. For example, the interlayer insulating film 110 may include an oxide film, and the etch stop film 115 may include a nitride film. The contact plugs 120 may include a conductive material such as doped polysilicon, or a metal such as tungsten.

A process of forming the interlayer insulating film 110 and the etch stop film 115 will now be described in more detail. An interlayer insulating layer (not shown) and an etch stop layer (not shown) are sequentially formed on the semiconductor substrate 105. Then, a plurality of contact holes (not shown) are formed using a general photolithography and etch processes. The contact holes penetrate the interlayer insulating layer and the etch stop layer, and expose the cell region (C). Then, the contact holes are filled with a contact plug layer (not shown), and the formed contact plug layer is planarized to form the contact plugs 120.

It should be readily apparent that another structure or structures may be disposed on the semiconductor substrate 105, or interposed between the semiconductor substrate 105 and the interlayer insulating layer 110. For example, in the case of a DRAM device, a plurality of transistors (not shown) may be formed on the semiconductor substrate 105. Each transistor may include a source electrode (not shown), a drain electrode (not shown), and a gate electrode (not shown). For example, source regions within the semiconductor substrate 105 may be respectively connected to the contact plugs 120. Since the structure of the transistor is well known to those skilled in the art, a detailed description thereof is omitted here.

The cell region (C) and the peripheral region (P) in the drawings are merely examples, and it will be readily apparent to those skilled in the art that a plurality of cell regions (C) and a plurality of peripheral regions (P) may be arranged in an array. Furthermore, the number of contact plugs 120 illustrated in the drawings is merely an example which does not in any way limit the scope of the present invention.

Figure 7:
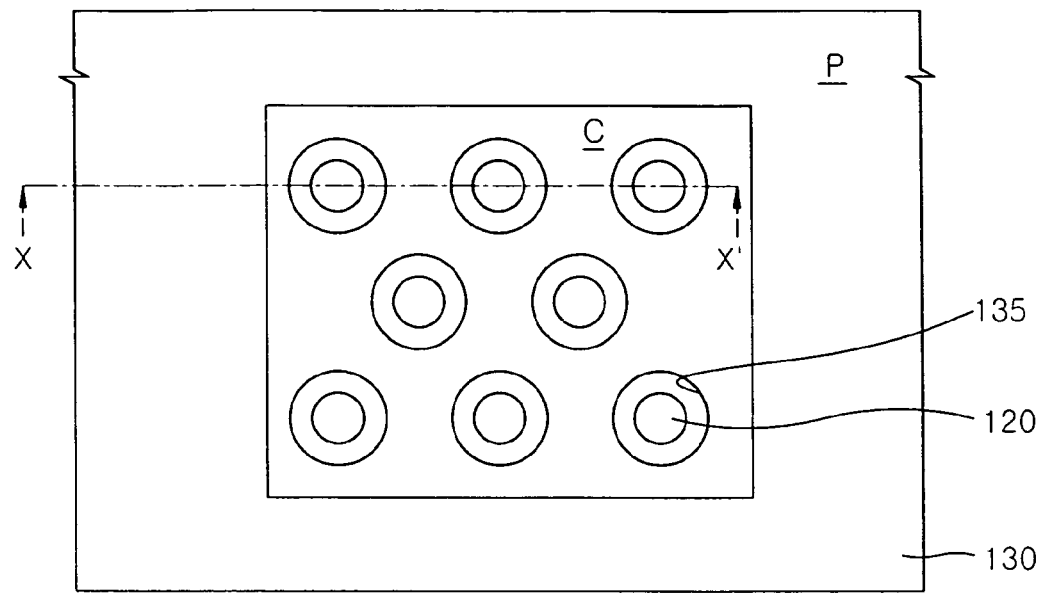
Figure 8:
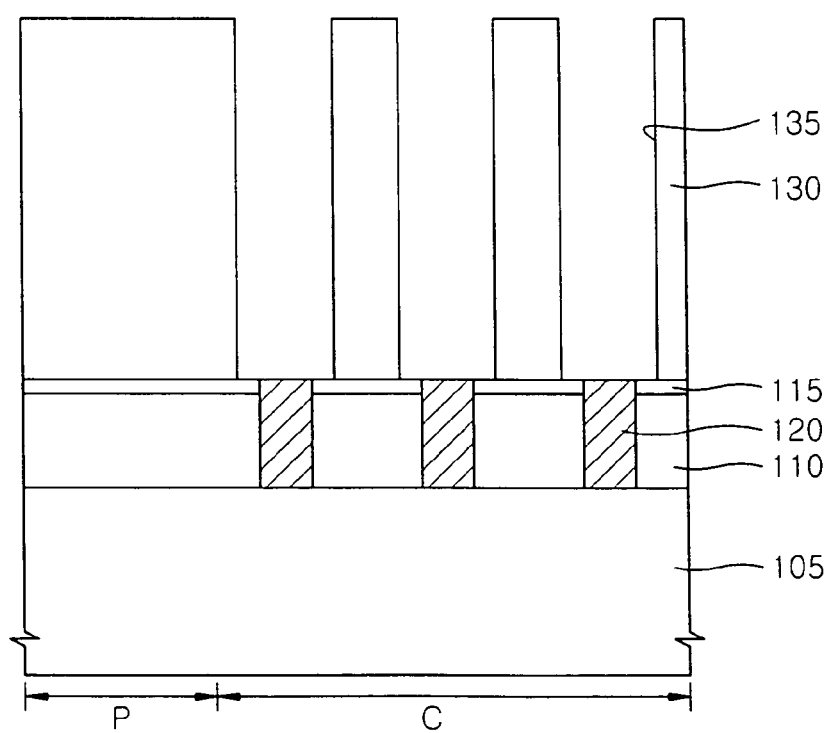

Referring to FIGS. 7 and 8, a mold insulating film 130 including a plurality of storage node electrode holes 135 is formed on the interlayer insulating film 110 with the etch stop film 115 interposed therebetween. The storage node electrode holes 135 respectively expose at least portions of the contact plugs 120. For instance, the mold insulating film 130 may be formed on the etch stop film 115. For example, the storage node electrode holes 135 may expose upper portions or parts of the upper portions of the contact plugs 120. For example, the mold insulating layer 130 may be an oxide layer.

A process of forming the mold insulating film 130 will now be exemplarily described. A mold insulating layer (not shown) is formed on the etch stop film 115. Then, a predetermined portion of the mold insulating layer is etched using conventional photolithography and etch processes, so that the storage node electrode holes 135 penetrating the mold insulating layer are formed. The etch stop film 115 may stop the etching of the mold insulating layer and thus prevent the interlayer insulating film 110 from being etched.

The shape of the storage node electrode holes 135 in the drawings is merely an example, and the storage node electrode holes 135 may have a variety of other shapes as selected by those skilled in the art.

After the storage node electrode holes 135 are formed, wet etching may be further performed. The mold insulating film 130 is wet etched, and thus the diameters of the storage node electrode holes 135 may increase.

Figure 9:
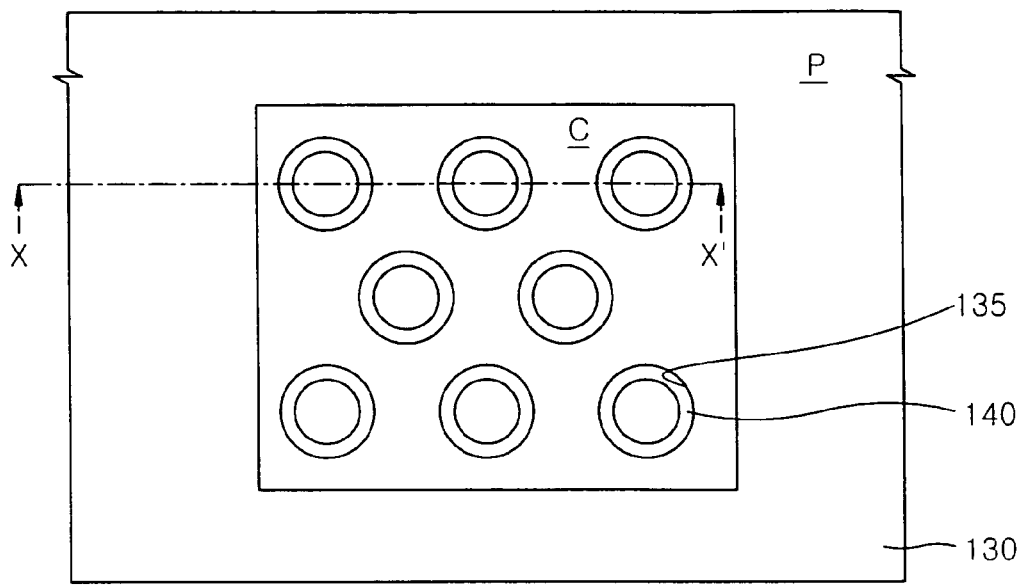

Referring to FIGS. 9 and 10, a plurality of storage node electrodes 140 are formed on inner surfaces of the storage node electrode holes 135. The storage node electrodes 140 are connected to portions of the contact plugs 120, for example, to upper portions thereof, respectively. The storage node electrodes 140 are physically separated from each other.

Each storage node electrode 140 includes a bottom portion 140a and a sidewall portion 140b. The bottom portions 140a are connected to the contact plugs 120, and the sidewall portions 140b are surrounded by the mold insulating film 130. Although the storage node electrodes 140 are cylindrical, the storage node electrodes 140 may be formed as a concave shape with various sectional shapes. The storage node electrodes 140 may include a conductive material such as doped polysilicon, Ti, TiN, Ta, TaN, W, or a mixture thereof (e.g., Ti/TiN or Ta/TaN).

Specifically, a storage node electrode layer (not shown) is formed on an entire surface of a resulting structure including the storage node electrode holes 135 using a chemical vapor deposition (CVD) process or an atomic layer deposition (ALD) process. Then, the storage node electrode layer is planarized using a chemical mechanical polishing (CMP) process, to thereby form separate storage node electrodes 140. Before this planarization, however, a buffer layer (not shown) may be further formed on the storage node electrode layer. The buffer layer may be removed after planarization.

In the drawings, the storage node electrodes 140 are connected to the cell region (C) by the contact plugs 120. However, according to an embodiment of the present invention, the storage node electrodes 140 may be directly connected to the cell region (C) without the contact plugs 120. In another embodiment, the storage node electrodes 140 may be connected to the cell region (C) using a buffer pad (not shown).

Figure 11:
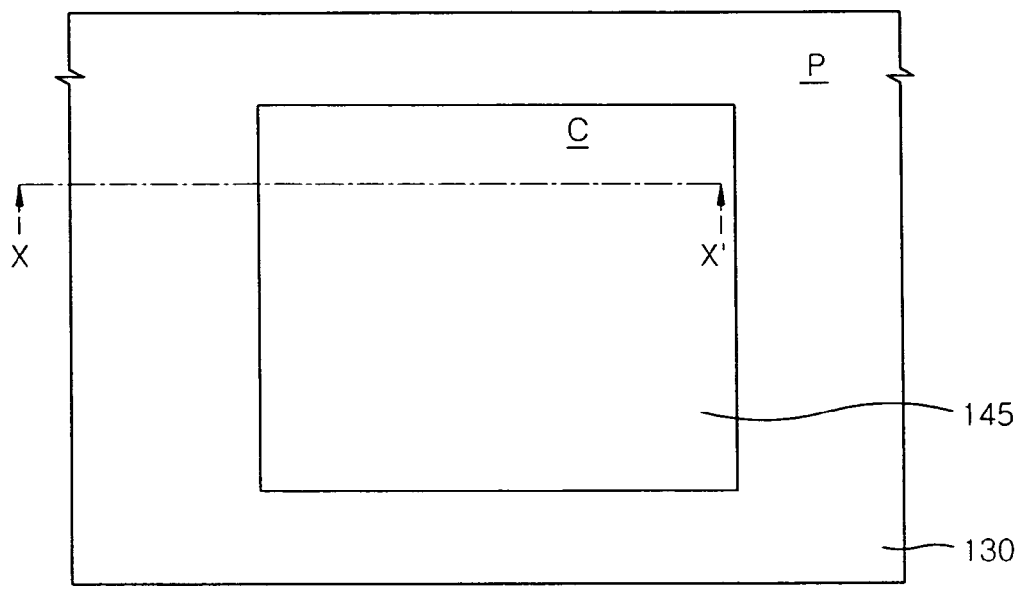
Figure 12:
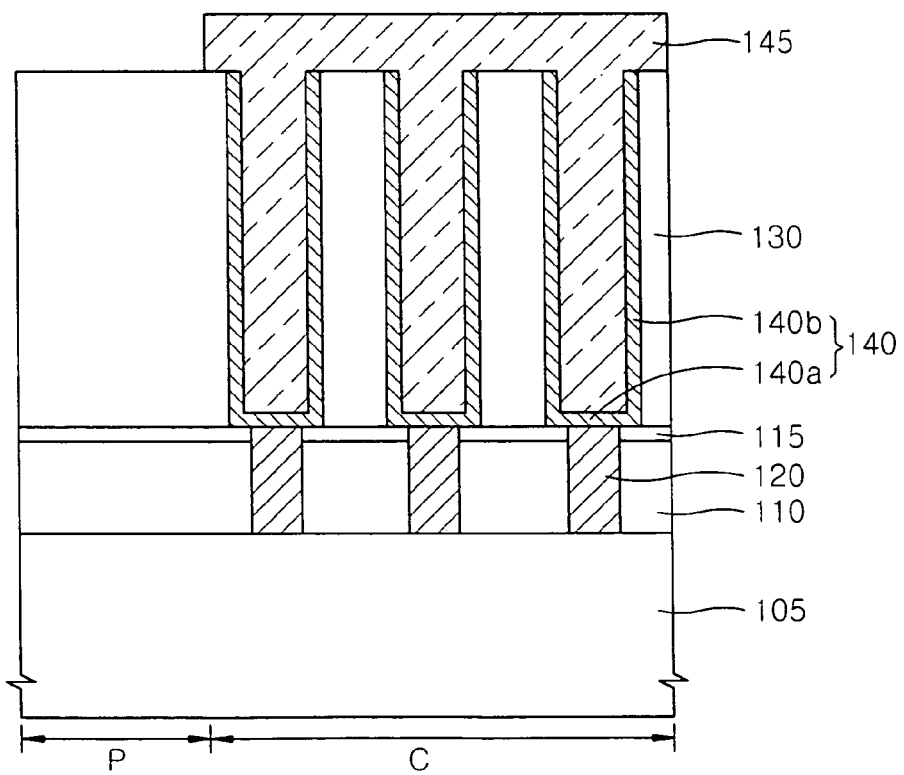

Referring to FIGS. 11 and 12, a capping film 145 covering the storage node electrodes 140 and a portion of the mold insulating film 130 on the cell region (C) is formed. A portion of the mold insulating layer 130 on the peripheral region (P) may be exposed from the capping film 145. For example, the concave storage node electrodes 140 may be filled with the capping film 145.

The capping film 145 may be formed of a material that exhibits etch selectivity with respect to the mold insulating film 130 and can be easily removed by dry etching. For example, the mold insulating film 130 may include an oxide film, and the capping film 145 may include a polysilicon layer, a photoresist layer, or an atomic carbon layer (ACL).

Specifically, a capping layer (not shown) is formed on a resulting structure including the storage node electrodes 140. The concave storage node electrodes 140 may be filled with the capping layer. For example, a photoresist layer may be formed by spin coating, or a polysilicon layer or an atomic carbon layer may be formed using a CVD process. Then, the capping layer on the peripheral region (P) is patterned to form the capping film 145 on the cell region (C). The patterning may be performed using photolithography and etch process. For example, an anti-reflection layer (not shown) and a photoresist layer (not shown) may be further used to pattern the atomic carbon layer or the polysilicon layer.

Referring to FIGS. 13 through 16, the mold insulating film 130 is selectively removed, and the sidewall portions 140b of the storage node electrodes 140 on which the capping film 145 is formed may be exposed.

Figure 13:
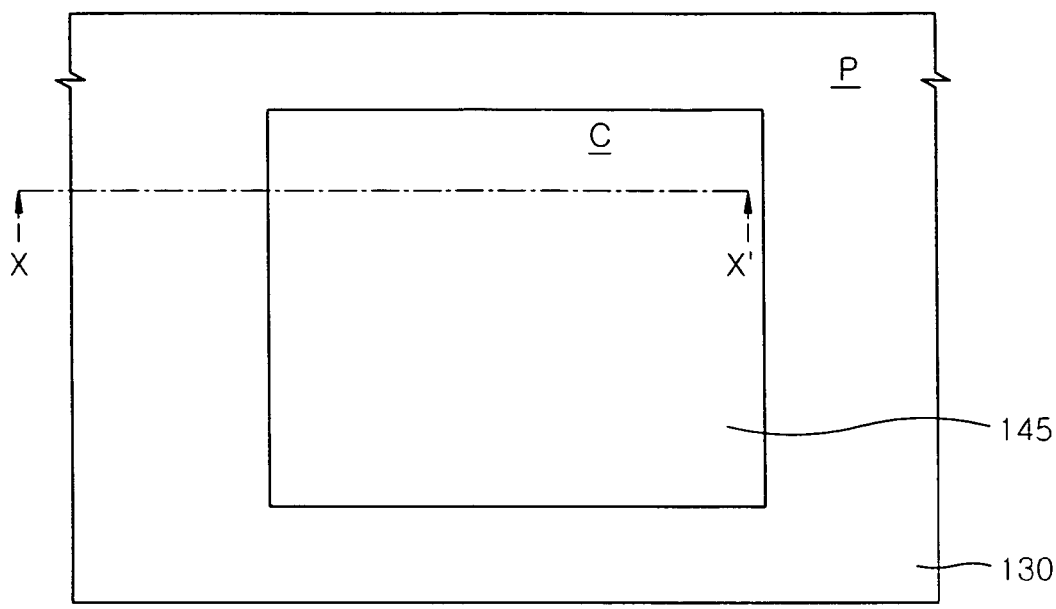
Figure 14:
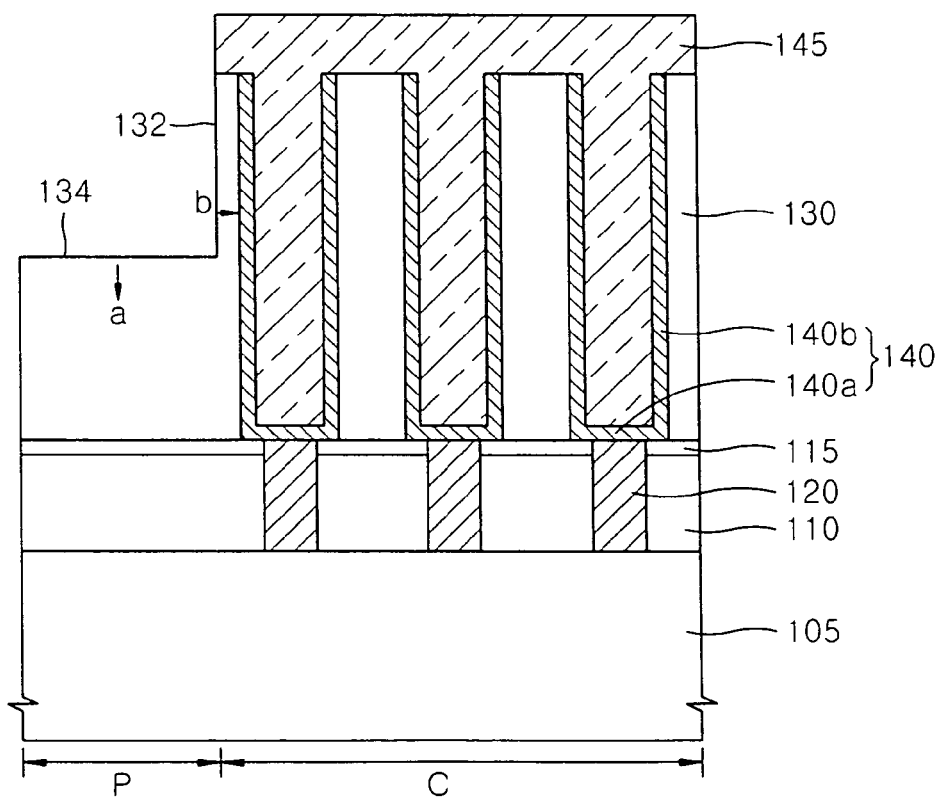
Figure 15:
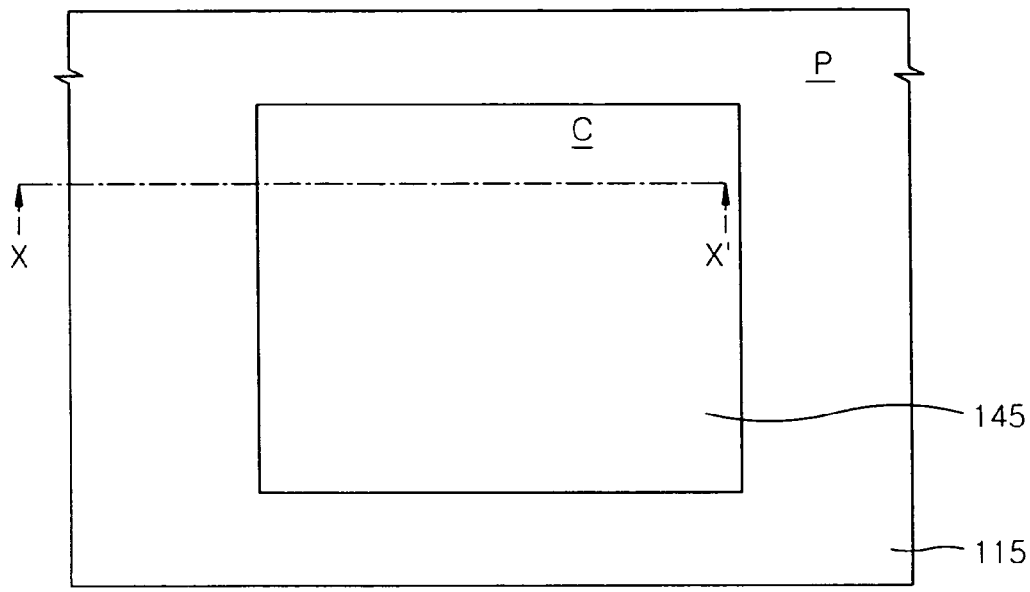

Referring to FIGS. 13 and 14, the portion of the mold insulating film 130 on the peripheral region (P) may be selectively removed to a predetermined depth with respect to the capping film 145. Thus, a sidewall 132 of the portion of the mold insulating film 130 on the cell region (C) and a top surface 134 of the portion of the mold insulating film 130 on the peripheral region (P) may be exposed. The selective etching of the mold insulating film 130 may be performed by dry etching.

Thereafter, referring to FIGS. 13 through 16, the mold insulating film 130 with the exposed sidewall 132 is removed by wet etching. As shown in FIG. 14, since the wet etching is isotropic etching, the etching may proceed not only downwardly in an 'a' direction, but also laterally in a 'b' direction. Accordingly, the wet etching may serve to remove both the portion of the mold insulating film 130 on the cell region (C) and the portion of the mold insulating film 130 on the peripheral region (P). The exposed sidewall 132 is for increasing an etch rate of the mold insulating film 130 on the cell region (C). Thus, the etch rate may be easily controlled by controlling the height of the exposed sidewall 132.

In the wet etching, a solution is preferably used which exhibits high selectivity with respect to the capping film 145 and the storage node electrode 140 to remove the mold insulating film 130. For example, when the mold insulating film 130 is an oxide film, the wet etching may be performed using a diluted hydrofluoric acid (HF) solution, a buffered oxide etchant (BOE) solution, or a mixture obtained by mixing those solutions in a predetermined ratio. The BOE solution is a mixture obtained by mixing diluted HF solution and $NH_4F$ solution in a predetermined ratio. The etch rate of the BOE solution may be controlled by controlling the mixing ratio of HF and $NH_4F$. For example, an LAL solution (i.e., the mixture of $NH_4F$ and HF) may be commercially obtained, and it is known that the LAL solution exhibits high selectivity with respect to a photoresist that may be used for the capping film and TiN that may be used for the storage node electrodes 140.

While the mold insulating film 130 is removed, the capping film 145 serves to fix and support the storage node electrodes 140. The conventional storage node electrodes 70 of FIG. 1 are weakly supported since they are supported individually, while the storage node electrodes 140 according to the current embodiment of the present invention are strongly supported because of the capping film 145 that fixes the storage node electrodes 140 all together. Accordingly, the capping film 145 does not collapse but instead remains in place when the mold insulating film 130 is removed. As a result, the storage node electrodes 140 attached to the capping film 145 do not collapse since they are supported by the capping film 145. In this manner, bridging between adjacent storage node electrodes 140 can be prevented or reduced.

According to the present embodiment, the sectional area of the bottom portions 140a of the storage node electrodes 140 may be reduced, and the height of the sidewall portions 140b may be increased. This is because the capping film 145 can support the storage node electrodes 140 and thus can prevent or reduce the occurrence of bridging. Accordingly, the storage node electrodes 140 may be disposed on the cell region (C) at a higher density, so that a high integration and high capacity semiconductor device, for example, a DRAM, may be achieved.

In addition, unlike the conventional art, when the mold insulating film 130 is removed, galvanic corrosion due to an etching solution may be prevented because the upper portions of the storage node electrodes 140 are covered with the capping film 145, and thus the etching solution cannot permeate the bottom portions 140a of the storage node electrodes 140. Accordingly, voids in a material under the storage node electrodes 140, for example, the contact plugs 120, may be prevented or reduced.

According to an embodiment of the present invention, the mold insulating film 130 may be removed only by wet etching. In this case, the wet etching begins from the exposed portion of the mold insulating film 130 on the peripheral region (P). However, since the wet etching is isotropic etching, the same amount of etching occurs in both the 'a' and 'b' directions (see FIG. 14). Thus, the sidewalls 132 of the portion of the mold insulating film 130 of the cell region (C) may be exposed during the wet etching. Accordingly, as the wet etching is continued, the portion of the mold insulating film 130 on the cell region (C) covered with the capping film 145 may be removed, as well as the portion of the mold insulating film 130 on the peripheral region (P).

Figure 16:
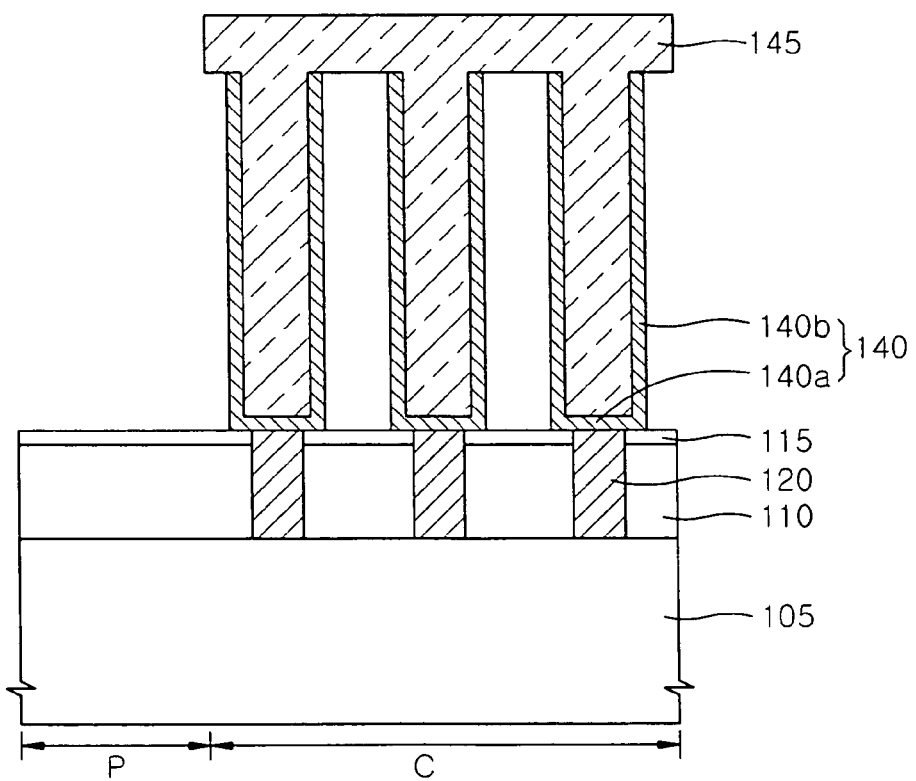
Figure 17:
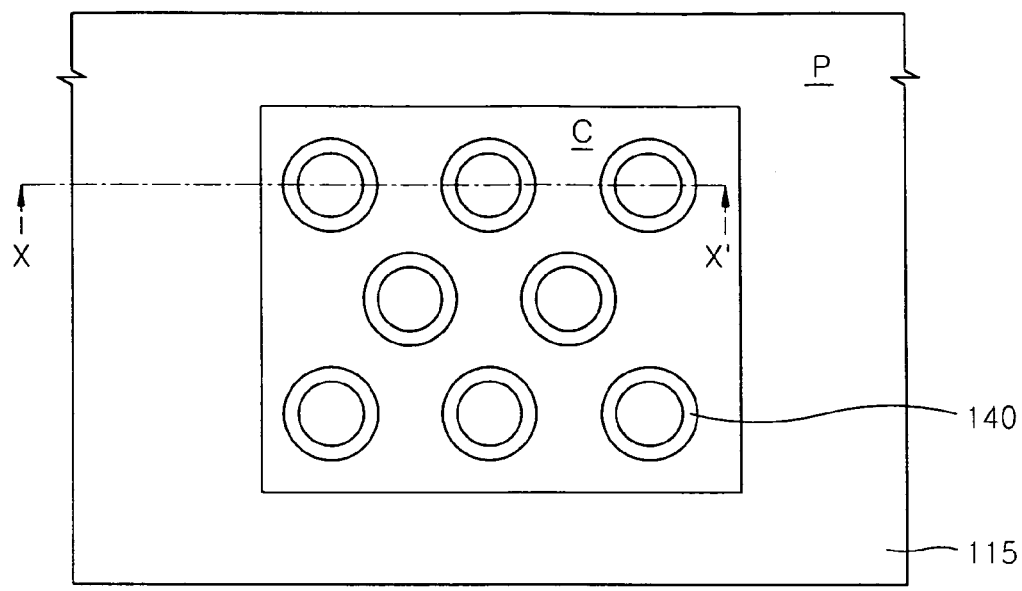
Figure 18:
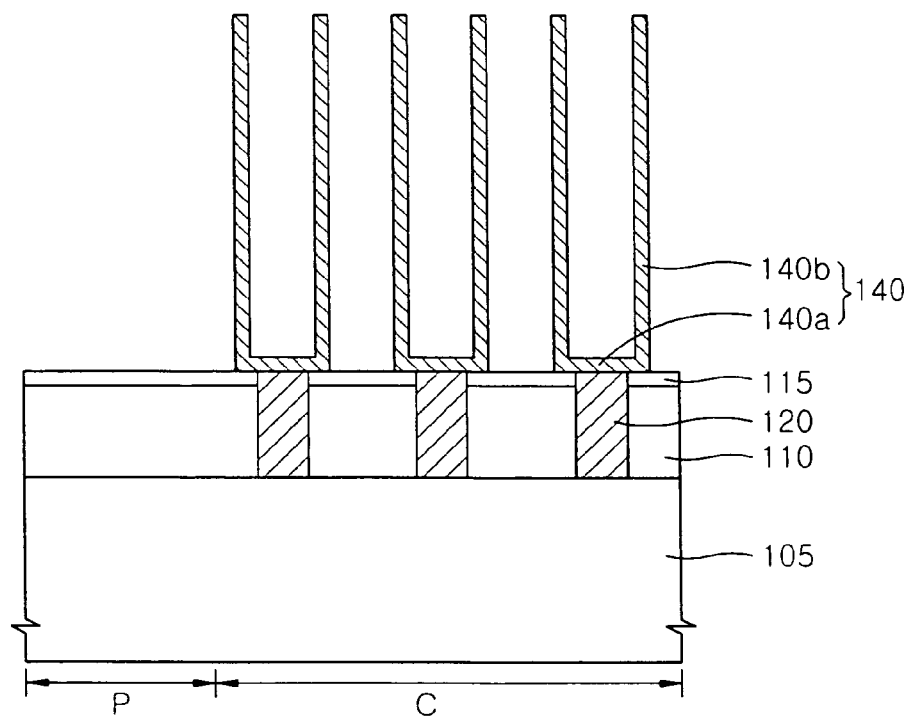

Referring to FIGS. 17 and 18, the capping film 145 of FIG. 16 is removed, and the upper portions of the storage node electrodes 140 may be exposed. Thus, the inner and outer surfaces of the sidewall portions 140b, and a top part of the bottom portions 140a of the storage node electrodes 140 may be exposed.

The capping film 145 is removed by dry etching. For example, when the capping film 145 is a polysilicon layer, the capping film 145 may be removed using a chemical dry etch (CDE) process. For example, in the CDE process, a gaseous mixture of $CF_4$ and $O_2$ is used to secure high selectivity with respect to the storage node electrodes 140, for example, a TiN layer.

In another example, when the capping film 145 is a photoresist layer, the dry etching is performed by an ashing process using oxygen, or a photoresist strip process using ozone vapor. A photoresist strip process using ozone vapor is referenced in Korean Patent Application No. 2005-0045385, the applicant of which is Samsung Electronics Co., Ltd.

Additionally, the CDE process may be followed by a dry washing process, for example, a native oxide removal (NOR) washing process. The NOR process is performed to remove residue that exists after the CDE process.

Since the capping film 145 is removed by dry etching, a water film or a watermark is not generated between the storage node electrodes 140 during the removal of the capping film 145. Accordingly, the probability of bridging between the storage node electrodes 140 is substantially reduced during removal of the capping film 145.

After the capping film 145 is removed, an organic strip process may be further performed. However, even in this case, the surface tension of organic strippers is much smaller than that of water. For this reason, bridging between the storage node electrodes 140 may be substantially reduced as compared to the conventional art. Also, after the organic stripping, isopropyl alcohol (IPA) drying may be further performed. Even in this case, the surface tension of IPS is less than half the surface tension of water. Thus, bridging between the storage node electrodes 140 may be substantially reduced as compared to the conventional art. For example, the surface tension of IPA may be about 23 dyn/$cm^2$ and the surface tension of water may be about 73 dyn/$cm^2$.

Accordingly, as illustrated in FIGS. 13 through 18, when the mold insulating film 130 and the capping film 145 are removed to expose upper portions and the sidewall portions 140b of the storage node electrodes 140, bridging between the storage node electrodes 140 may be prevented or reduced. Therefore, according to the current embodiment of the present invention, the storage node electrodes 140 may optionally be disposed at a higher density and/or with a greater height as compared with the conventional art.

Then, succeeding processes may be performed depending on the type of semiconductor memory device. For example, in the case of a DRAM device, a dielectric film (not shown) may be formed on the exposed storage node electrodes 140. That is, the dielectric film may be formed on the inner and outer surfaces of the sidewall portions 140b of the storage node electrodes 140, and on the bottom portions 140a thereof. Then, a plate electrode (not shown) may be further formed on the dielectric film.

That is, the storage node electrodes 140, a dielectric film, and a plate electrode may together define a capacitor structure. The formation of the dielectric film and the plate electrode may be performed using known methods. For example, U.S. Pat. No. 6,855,597 by Shin, Chul-Ho et al., may provide an example of a structure of the dielectric film and the plate electrode, and a method of forming the same.

Then, a metal line structure connected to the capacitor structure may be further formed. The metal line structure may also be formed using known methods.

Figure 19:
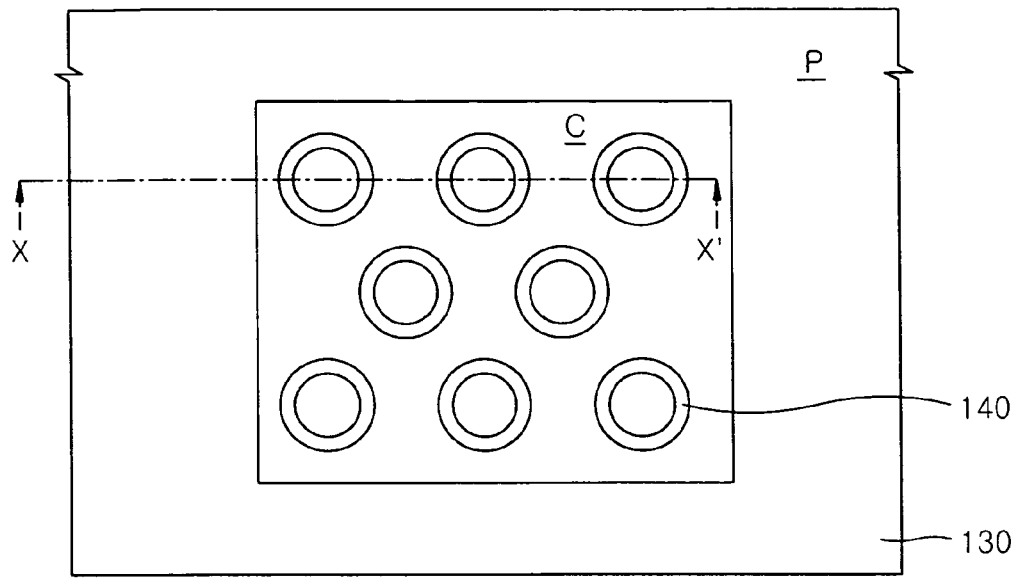
FIGS. 19 through 22 are plan views and corresponding cross sectional views for describing a method of fabricating a semiconductor memory device according to another embodiment of the present invention.
Figure 20:
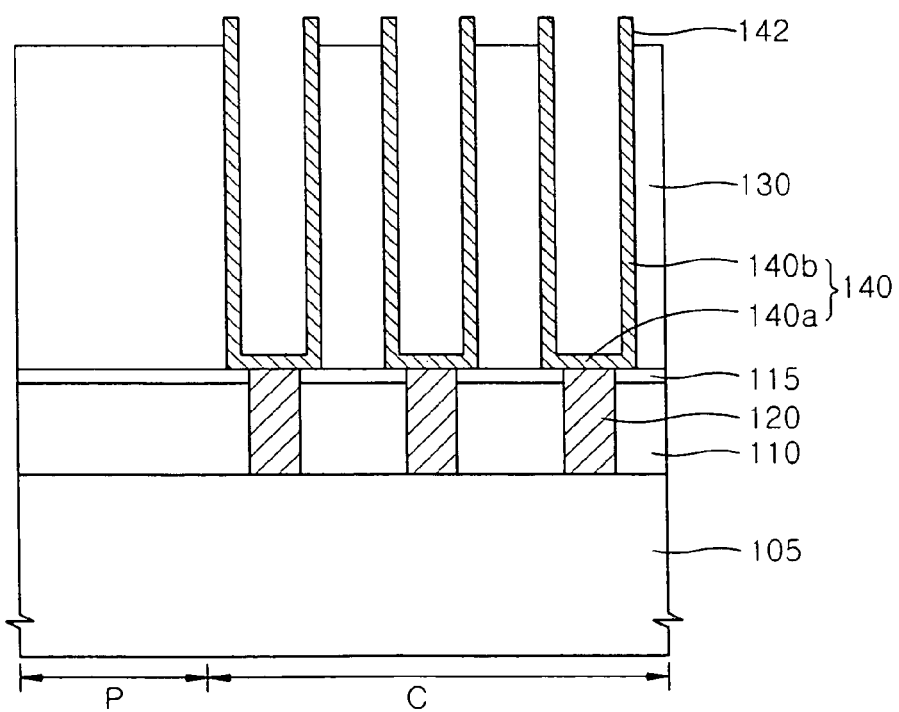
Figure 21:
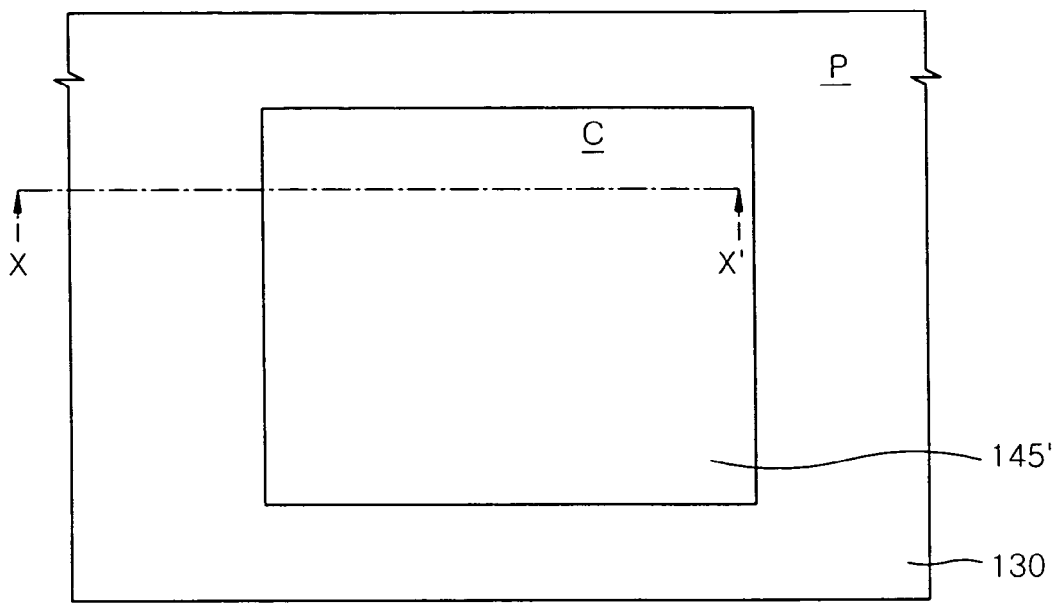
Figure 22:
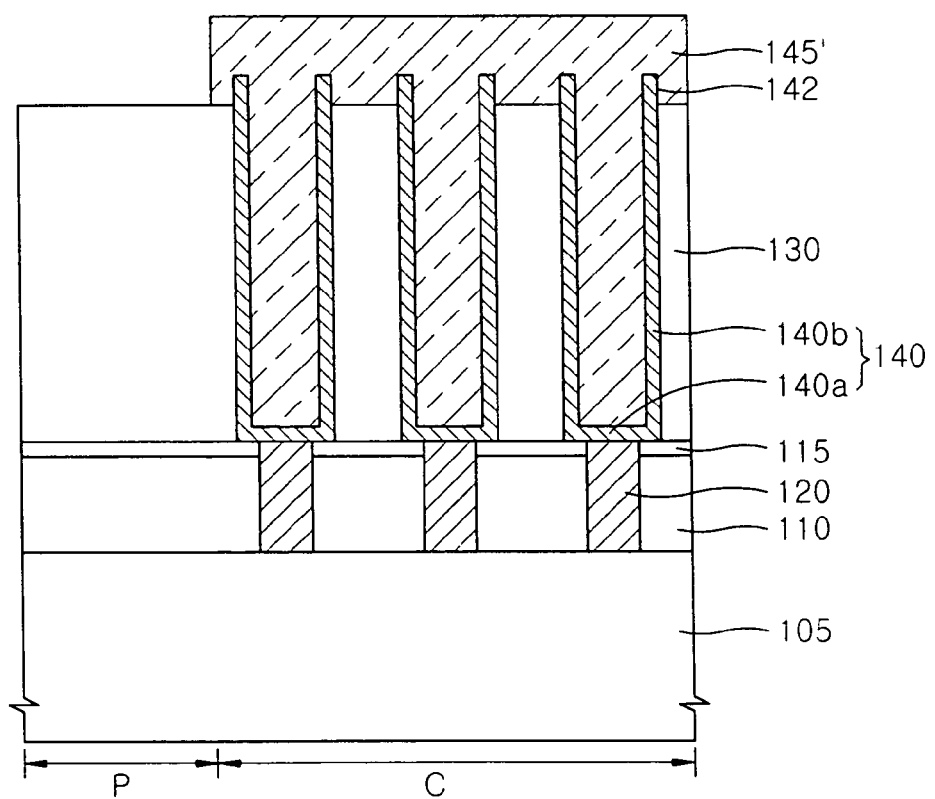

Referring to FIGS. 19 through 22, a method of fabricating a semiconductor memory device according to another embodiment of the present invention will now be described. FIGS. 19 and 21 are plan views, and FIGS. 20 and 22 are cross-sectional views taken along lines X-X' of FIGS. 19 and 21, respectively.

The current embodiment is a modified example of the previous described embodiment, and thus the description of previous embodiment may be used as a reference in understanding the current embodiment. In this example, FIGS. 19 through 22 contain modifications of FIGS. 11 and 12 of the previous embodiment. Therefore, the current embodiment may be understood by making reference to the description associated FIGS. 5 through 10 and FIGS. 13 through 18, together with the description that follows of FIGS. 19 through 22. A description of elements and features of the current embodiment that are similar to the previous embodiment is omitted below to avoid redundancy.

As illustrated in FIGS. 5 through 10 and as described in detail above, a plurality of storage node electrodes 140 connected to portions of a plurality of contact plugs 120 are formed on inner surfaces of a plurality of storage node holes 135 within a mold insulating film 130.

Next, referring to FIGS. 19 and 20, the mold insulating film 130 is etched to a predetermined depth to expose parts of sidewall portions 140b of the storage node electrodes 140. For example, outer upper parts 142 of the sidewall portions. 140b may be exposed.

The mold insulating film 130 may be etched by dry etching or wet etching. The etching of the mold insulating film 130 is performed with selectivity to the storage node electrodes 140. For example, when the mold insulating film 130 is an oxide film, a diluted HF solution, a BOE solution or a mixture thereof obtained by mixing those solutions at a predetermined ratio may be used. As for the mixture thereof, a commercially available LAL solution may be used.

Referring to FIGS. 21 and 22, a capping film 145' is formed to cover the storage node electrodes 140, and a portion of the mold insulating film 130 on a cell region (C), and exposes a portion of the mold insulating film 130 on the peripheral region (P). The capping film 145' is different from the capping film 145 of FIG. 12 of the previous embodiment in that it encompasses the outer upper parts 142 of the sidewall portions 140b of the storage node electrodes 140.

A storage node electrode layer (not shown) is formed on a resulting structure where the outer upper parts 142 of the sidewall portions 140b are exposed. Then, the storage node electrode layer is patterned to form the storage node electrodes 140.

Then, as illustrated in FIGS. 13 through 18 and as described in detail above, the mold insulating film 130 and the capping film 145' are removed, and the sidewall portions 140b of the storage node electrodes 140 may be exposed.

Then, as described in connection with the previous embodiment, succeeding processes may be performed depending on the type of semiconductor memory device being fabricated.

The current embodiment has all the advantages of previous embodiment, and may be more effective preventing or reducing bridging as compared to previous embodiment. That is, according to the current embodiment, the storage node electrodes 140 may be supported by the capping film 145' when the mold insulating film 130 is removed. The capping film 145' fixes not only the sidewall portions 140b of the storage node electrodes 140, but also the outer upper parts 142 thereof. Accordingly, bridging between adjacent storage node electrodes 140 can be prevented or reduced during the removal of the mold insulating film 130. That is, even though an elastic force (see 'F$_e$' of FIG. 1) exists between the storage node electrodes 140, bridging can be prevented or reduced as a result of the support provided by the capping film 145'.

Figure 23:
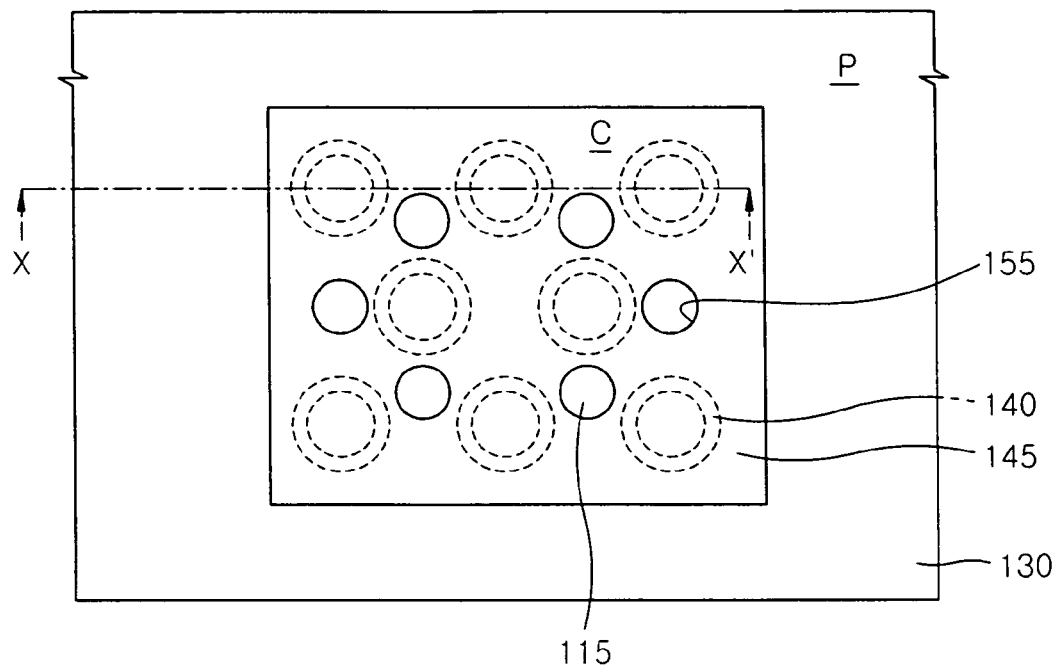
FIGS. 23 and 24 are a plan view and a corresponding cross-sectional view, respectively, for describing a method of fabricating a semiconductor memory device according to another embodiment of the present invention.
Figure 24:
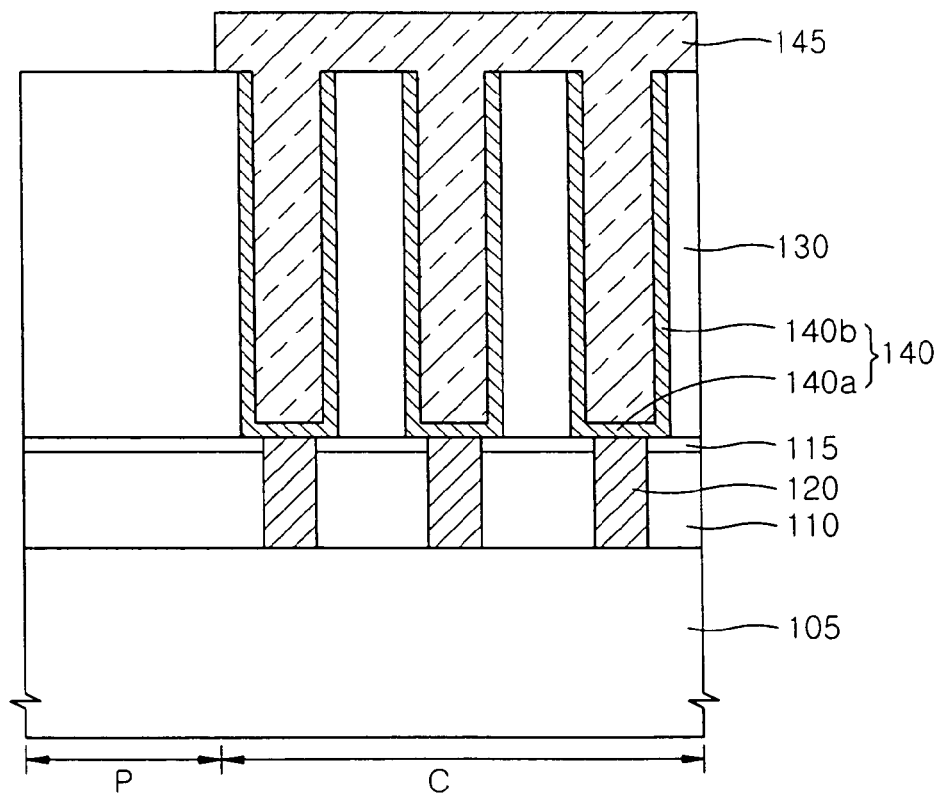

Referring to FIGS. 23 and 24, a method of fabricating a semiconductor memory device according to another embodiment of the present invention will now be described. FIG. 23 is a plan view, and FIG. 24 is a cross-sectional view taken along a line X-X' of FIG. 23.

The current embodiment is a modified example of the first described embodiment, and thus the description of first described embodiment may be used as a reference in understanding the current embodiment. In this example, FIGS. 23 and 24 are inserted after FIGS. 11 and 12 of the first described embodiment. Therefore, the current embodiment may be understood by making reference to the description associated FIGS. 5 through 18, together with the description that follows of FIGS. 23 and 24. A description of elements and features of the current embodiment that are similar to the first described embodiment is omitted below to avoid redundancy.

Referring to FIGS. 5 through 12 and as described in detail above, a capping film 145 covering a plurality of storage node electrodes 140 and a portion of a mold insulating film 130 on a cell region (C) may be formed.

Referring to FIGS. 23 and 24, a plurality of contact holes 155 penetrate the capping film 145 and at least an upper part of the mold insulating film 130, and are disposed between at least some of the storage node electrodes 140. For example, the contact holes 155 may penetrate the capping film 145 and the mold insulating film 130 to expose an etch stop film 115. The contact holes 155 may be formed only down to a middle part of the mold insulating film 130, and thus the mold insulating film 130 may be exposed by the contact holes 155.

As illustrated in the drawings, the contact holes 155 may be disposed between adjacent storage node electrodes 140. However, the number of contact holes 155 is not limited, and the contact holes 155 may be formed between some of the storage node electrodes 140. The contact holes 155 may be misaligned to contact the storage node electrodes 140. Even if the contact holes 155 are misaligned, the storage node electrodes 140 are not etched because etch selectivity may be controlled. The sectional area of the contact holes 155 may be smaller than that of at least bottom portions 140a of the storage node electrodes 140.

Then, as illustrated in previously described FIGS. 13 through 18, the mold insulating film 130 and the capping film 145 are removed, and the sidewall portions 140b of the storage node electrodes 140 may be exposed.

Then, as described in connection with the previous embodiment, succeeding processes may be performed depending on the type of semiconductor memory device being fabricated.

The current embodiment has all the advantages of first described embodiment, and may further improve etch efficiency and an etch rate of the mold insulating film 130 as compared to first described embodiment. That is, the contact holes 155 provide a path through which an etching solution permeates during the etching of the mold insulating film 130. Accordingly, etching may be started in the peripheral region P and the contact holes 155 at the same time, so that the etching efficiency and the etch rate may be improved as compared to first described embodiment.

Figure 25:
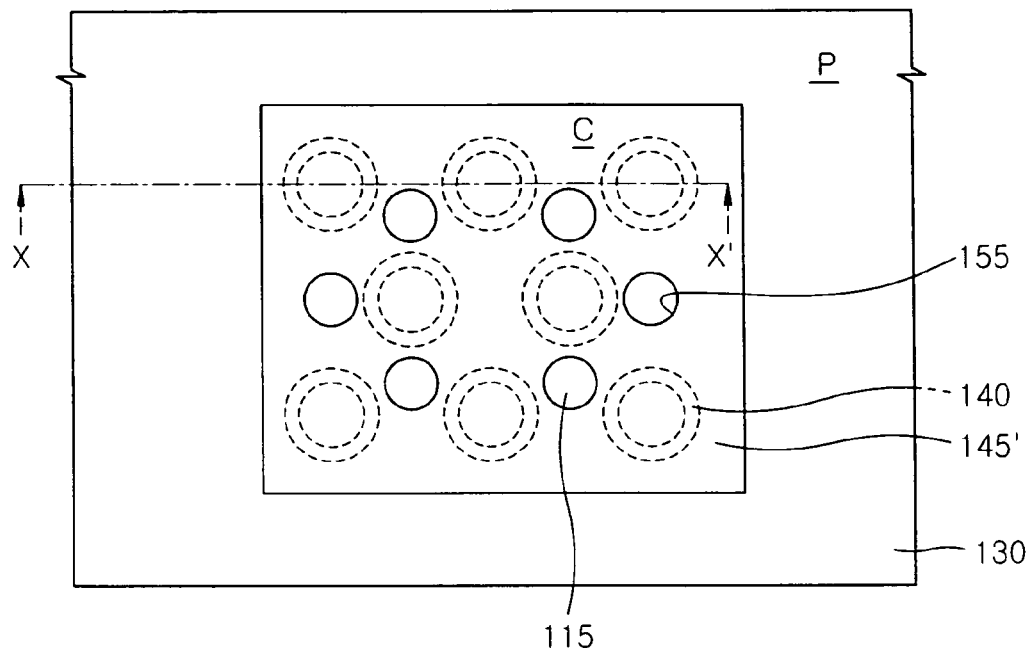
FIGS. 25 and 26 are a plan view and a corresponding cross-sectional view, respectively, for describing a method of fabricating a semiconductor memory device according to another embodiment of the present invention.
Figure 26:
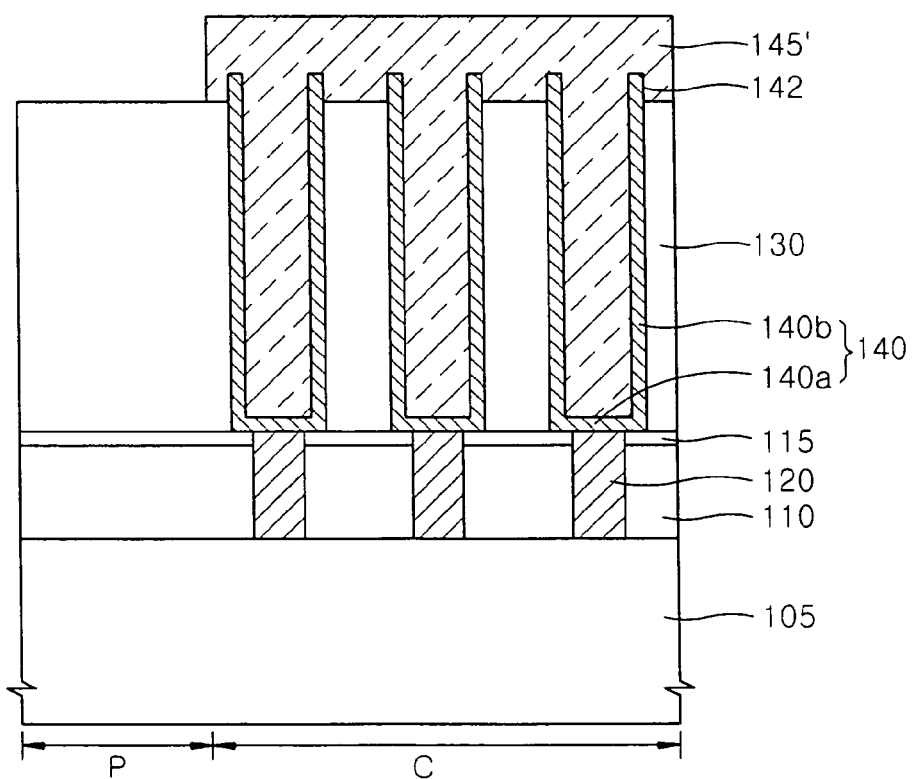

Referring to FIGS. 25 and 26, a method of fabricating a semiconductor memory device according to another embodiment of the present invention will now be described. FIG. 25 is a plan view, and FIG. 26 is a cross-sectional view taken along a line X-X' of FIG. 25.

The current embodiment is a modified example of the previously described embodiments, and thus the descriptions of the previously described embodiments may be used as a reference in understanding the current embodiment. In this example, FIGS. 23 and 24 are inserted after FIGS. 19 through 22 of the embodiment described in connection with FIGS. 19 through 22. However, it will be apparent below, that the current embodiment may be utilized to modify any of the aforementioned three embodiments. A description of elements and features of the current embodiment that are similar to the previously described embodiments is omitted below to avoid redundancy.

As illustrated in FIGS. 5 through 10 and as described in detail above, a plurality of storage node electrodes 140 connected to portions of a plurality of contact plugs 120 are formed on inner surfaces of a plurality of storage node electrode holes 135 within a mold insulating film 140.

Then, as illustrated in FIGS. 19 through 22 and as described in detail above, a capping film 145' is formed to cover the storage node electrodes 140 each having an exposed outer upper part 142 of a sidewall portion 140b, and a portion of the mold insulating film 130 on the cell region (C).

Next, referring to FIGS. 25 and 26, a plurality of contact holes 155 may be formed. The contact holes 155 penetrate the capping film 145' and at least upper parts of the mold insulating film 130 etched to a predetermined thickness, and are disposed between at least some of the storage node electrodes 140.

It is noted that the embodiment of FIGS. 23 and 24 may be used as further reference with respect to formation of the contact holes 155.

Then, as illustrated in FIGS. 13 through 18 and a described in detail above, the mold insulating film 130 and the capping film 145' are removed, and the sidewall portions 140b of the storage node electrodes 140 may be exposed.

Then, as described in connection with the previous embodiment, succeeding processes may be performed depending on the type of semiconductor memory device being fabricated.

The current embodiment may have all the advantages of the previously described embodiments. That is, according to the current embodiment, bridging between the storage node electrodes 140 may be prevented or reduced as compared to the conventional art. Also, the generation of voids in a material located under the storage node electrodes 140, for example, contact plugs 120 may be prevented reduced. Therefore, the storage node electrodes 140 according to the current embodiment of the present invention may optionally be disposed at higher density and/or with a greater height as compared to the conventional art.

FIGS. 27 through 30 are cross-sectional microphotographs showing results of an experiment carried out in connection with an embodiment of the present invention. FIGS. 27 through 30 generally correspond to processes illustrated in FIGS. 13 through 16 of the first described embodiment. However, the mold insulating film 230 of FIGS. 27 through 30 was etched to a predetermined thickness as described in connection with the embodiment of FIG. 20.

Figure 27:
FIGS. 27 through 30 are cross-sectional microphotographs for use in describing experimental results associated with embodiments of the present invention.

Referring to FIG. 27, a capping film 245' was formed of photoresist. The capping film 245' covered a plurality of storage node electrodes 240. The mold insulating film 230 was formed of tetraethooxysilane (TEOS) oxide using a plasma CVD process. The mold insulating film 230 on a peripheral region of a semiconductor substrate 205 was etched to a predetermined thickness as illustrated in FIG. 14.

Figure 28:

FIG. 28 shows a process of removing the mold insulating film 230. The etching of the mold insulating film 230 was performed using an LAL solution. Sidewalls of the storage node electrodes 240 were exposed above a boundary line 260, and the mold insulating film 230 was not removed below the boundary line 260. As wet etching with respect to the mold insulating film 230 was performed from top to bottom and from right to left, the etching boundary line appears to be slanted.

Figure 29:

Referring to FIG. 29, as the wet etching was further performed, the mold insulating film 230 of FIG. 28 was completely removed, and all the sidewalls of the storage node electrodes 240 were exposed. From the microphotograph, it can be seen that the storage node electrodes 240 are well supported by the capping film 245' while the mold insulating film 230 is removed.

Figure 30:
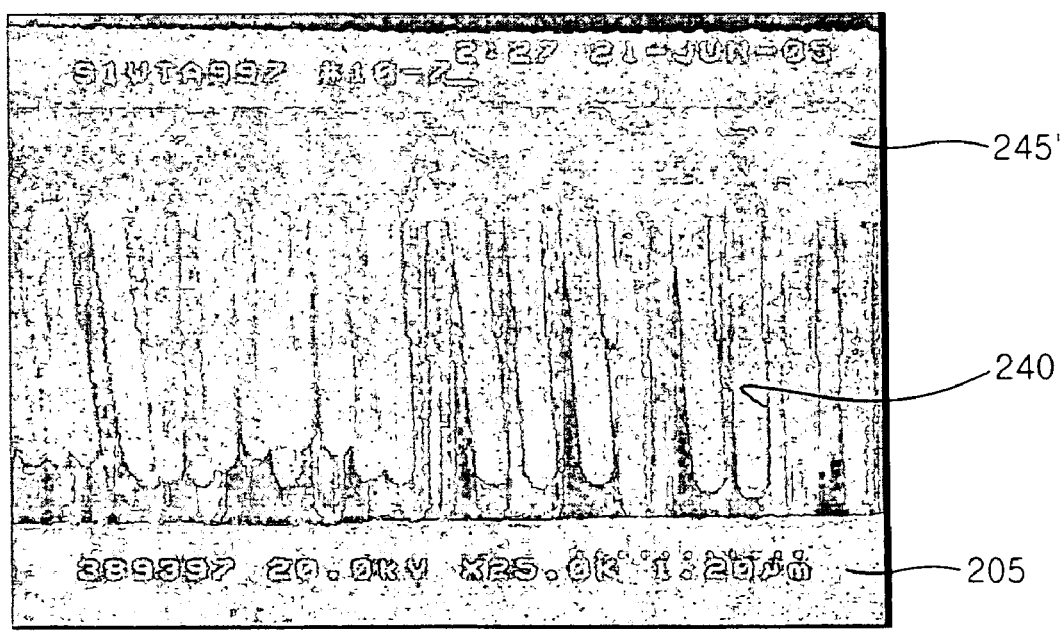

Referring to FIG. 30, it was observed that the storage node electrodes 240 were detached from the semiconductor substrate 205 when the wet etching was performed for an excessive period of time or a wet solution performs etching at an excessive rate. Accordingly, the wet etching time and the etch rate of the wet solution should be adequately controlled when etching the mold insulating film 230.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor memory device, the method comprising:
   forming a mold insulating film over first and second portions of a semiconductor substrate, the mold insulating film comprising a plurality of storage node electrode holes spaced apart over the first portion of the semiconductor substrate;
   forming a plurality of storage node electrodes on inner surfaces of the storage node electrode holes, respectively;
   forming a capping film which covers the storage node electrodes and a first portion of the mold insulating film located over the first portion of the semiconductor substrate, and which exposes a second portion of the mold insulating film located over the second portion of the semiconductor substrate;
   selectively removing, including wet etching, the mold insulating film to expose a sidewall of at least one storage node electrode among the storage node electrodes covered by the capping film; and
   after removing the mold insulating film, removing the capping film to expose upper portions of the storage node electrodes.

2. A method of fabricating a semiconductor memory device, the method comprising:
   forming a mold insulating film over first and second portions of a semiconductor substrate, the mold insulating film comprising a plurality of storage node electrode holes spaced apart over the first portion of the semiconductor substrate;
   forming a plurality of storage node electrodes on inner surfaces of the storage node electrode holes, respectively;
   forming a capping film which covers the storage node electrodes and a first portion of the mold insulating film located over the first portion of the semiconductor substrate, and which exposes a second portion of the mold insulating film located over the second portion of the semiconductor substrate;
   selectively removing the second portion of the mold insulating film exposed by the capping film to a predetermined depth with respect to the capping film to expose a part of a sidewall of the first portion of the mold insulating film covered by the capping film, and then wet etching the mold insulating film to expose a sidewall of at least one storage node electrode among the storage node electrodes covered by the capping film; and
   removing the capping film by dry etching to expose upper portions of the storage node electrodes.

3. The method of claim 2, wherein selectively removing the second portion of the mold insulating film to a predetermined depth comprises dry etching.

4. The method of claim 1, wherein the capping film comprises a material exhibiting wet etch selectivity with respect to the mold insulating film and the storage node electrodes.

5. The method of claim 4, wherein the capping film comprises one of a polysilicon layer, a photoresist layer and an atomic carbon layer (ACL).

6. The method of claim 3, wherein the dry etching comprises ashing or chemical dry etching (CDE).

7. The method of claim 3, wherein the capping film is a photoresist layer, and the dry etching comprises a photoresist strip process using ozone vapor.

8. The method of claim 4, wherein the mold insulating film comprises an oxide film, and the wet etching is performed using a diluted hydrofluoric acid solution (HF), a buffered oxide etchant (BOE) solution, or a mixture of the diluted HF solution and the BOF solution.

9. The method of claim 1, further comprising forming an etch stop film over the semiconductor substrate before the forming of the mold insulating film.

10. The method of claim 1, further comprising:
    before forming the capping film, etching the mold insulating film to a depth which exposes portions of sidewalls of the storage node electrodes protruding above the etched mold insulating film.

11. The method of claim 1, further comprising:
    before selectively removing the mold insulating film, forming a plurality of contact holes which penetrate the capping film and at least an upper portion of the mold insulating film, and which are located between at least some of the storage node electrodes.

12. A method of forming a semiconductor memory device, the method comprising:
    forming an interlayer insulating film over a semiconductor substrate in which a cell region and a peripheral region are defined, the interlayer insulating film comprising a plurality of contact plugs located over the cell region of the semiconductor substrate;
    forming a mold insulating film over the interlayer insulating film, the mold insulating film comprising a plurality of storage node electrode holes which expose at least portions of the contact plugs, respectively;
    forming a plurality of storage node electrodes on inner surfaces of the storage node electrode holes, respectively, the storage node electrodes being spaced apart from each other and electrically connected to the respective contact plugs;
    forming a capping film which covers the storage node electrodes and a first portion of the mold insulating film located over the cell region of the semiconductor substrate, and which exposes a second portion of the mold insulating film located over the peripheral region of the semiconductor substrate;

selectively removing, including wet etching, the mold insulating film to expose a sidewall of at least one storage node electrode among the storage node electrodes covered by the capping film; and after removing the mold insulating film, removing the capping film to expose upper portions of the storage node electrodes.

13. The method of claim 12, wherein selectively removing the mold insulating film comprises:

selectively removing the second portion of the mold insulating film exposed by the capping film to a predetermined depth with respect to the capping film to expose a part of a sidewall of the first portion of the mold insulating film covered by the capping film and then wet etching the mold insulating film.

14. The method of claim 13, wherein selectively removing the second portion of the mold insulating film to a predetermined depth comprises dry etching.

15. The method of claim 12, wherein the capping film comprises a material which exhibits wet etch selectivity with respect to the mold insulating film and the storage node electrodes.

16. The method of claim 15, wherein the capping film comprises one of a polysilicon layer, a photoresist layer and an ACL (atomic carbon layer).

17. The method of claim 14, wherein removing the capping film comprises dry etching, and wherein the dry etching comprises ashing or CDE (chemical dry etching).

18. The method of claim 14, wherein removing the capping film comprises dry etching, and wherein the capping film is a photoresist layer, and the dry etching comprises a photoresist strip method using ozone vapor.

19. The method of claim 15, wherein the mold insulating film comprises an oxide film, and the wet etching is performed using a diluted HF solution, a BOF solution, or a mixture of the diluted HF solution and the BOF solution.

20. The method of claim 12, further comprising, before the forming of the mold insulating film, forming an etch stop film which exposes portions of the contact plugs.

21. A method of fabricating a semiconductor memory device, the method comprising:

forming an interlayer insulating film over a semiconductor substrate in which a cell region and a peripheral region are defined, the interlayer insulating film comprising a plurality of contact plugs located over the cell region of the semiconductor substrate;

forming a mold insulating film over the interlayer insulating film, the mold insulating film comprising a plurality of storage node electrode holes which expose at least portions of the contact plugs, respectively;

forming a plurality of storage node electrodes on inner surfaces of the storage node electrode holes, respectively, the storage node electrodes being spaced apart from each other and electrically connected to the respective contact plugs;

etching the mold insulating film to a depth which exposes portions of sidewalls of the storage node electrodes protruding above the etched mold insulating film;

forming a capping film which covers the storage node electrodes and a first portion of the etched mold insulating film located over the cell region of the semiconductor substrate, and which exposes a second portion of the etched mold insulating film located over the peripheral region of the semiconductor substrate;

selectively removing, including wet etching, the mold insulating film to expose a sidewall of at least one storage node electrode among the storage node electrodes covered by the capping film; and removing the capping film by dry etching to expose upper portions of the storage node electrodes.

22. The method of claim 21, wherein selectively removing the mold insulating film comprises:

selectively removing the second portion of the mold insulating film exposed by the capping film to a predetermined depth with respect to the capping film to expose a part of a sidewall of the first portion of the mold insulating film covered by the capping film; and then wet etching the mold insulating film.

23. The method of claim 22, wherein selectively removing the second portion of the mold insulating film to a predetermined depth comprises dry etching.

24. The method of claim 21, wherein the capping film comprises a material which exhibits wet etch selectivity with respect to the mold insulating film and the storage node electrodes.

25. The method of claim 24, wherein the capping film comprises one of a polysilicon layer, a photoresist layer and an ACL (atomic carbon layer).

26. The method of claim 23, wherein the dry etching comprises one of ashing, a photoresist strip method using ozone vapor, and CDE (chemical dry etching).

27. The method of claim 22, wherein the mold insulating film comprises an oxide film, and the wet etching is performed using a diluted HF solution, a BOF solution, or a mixture of the diluted HF solution and the BOF solution solutions.

28. The method of claim 21, further comprising:

before forming the mold insulating film, forming an etch stop film which exposes portions of the contact plugs.

29. A method of fabricating a semiconductor memory device, the method comprising:

forming an interlayer insulating film over a semiconductor substrate in which a cell region and a peripheral region are defined, the interlayer insulating film comprising a plurality of contact plugs located over the cell region of the semiconductor substrate;

forming a mold insulating film over the interlayer insulating film, the mold insulating film comprising a plurality of storage node electrode holes which expose at least portions of the contact plugs, respectively;

forming a plurality of storage node electrodes on inner surfaces of the storage node electrode holes, respectively, the storage node electrodes being spaced apart from each other and electrically connected to the respective contact plugs;

forming a capping film which covers the storage node electrodes and a first portion of the mold insulating film located over the cell region of the semiconductor substrate, and which exposes a second portion of the mold insulating film located over the peripheral region of the semiconductor substrate;

forming a plurality of contact holes which penetrate the capping film and at least an upper part of the first portion of the mold insulating film, and which are located between at least some of the storage node electrodes;

selectively removing, including wet etching, the mold insulating film having the contact holes formed therein to expose a sidewall of at least one storage node electrode among the storage node electrodes covered by the capping film; and removing the capping film by dry etching to expose upper portions of the storage node electrodes.

30. The method of claim 29, wherein selectively removing of the mold insulating film comprises:

selectively removing the second portion of the mold insulating film exposed by the capping film to a predetermined depth with respect to the capping film to expose a part of a sidewall of the first portion of the mold insulating film covered by the capping film; and wet etching the mold insulating film.

31. The method of claim 30, wherein selectively removing the mold insulating film to a predetermined depth comprises dry etching.

32. The method of claim 29, wherein the capping film comprises a material which exhibit wet etch selectivity with respect to the mold insulating film and the storage node electrodes.

33. The method of claim 32, wherein the capping film comprises one of a polysilicon layer, a photoresist layer and an ACL (atomic carbon layer).

34. The method of claim 31, wherein the dry etching comprises one of ashing, a photoresist strip method using ozone vapor, and CDE (chemical dry etching).

35. The method of claim 30, wherein the mold insulating film comprises an oxide film, and the wet etching is performed using a diluted HF solution, a BOF solution, or a mixture of the diluted HF solution and the BOF solution.

36. The method of claim 29, wherein the contact holes penetrate the capping film and the mold insulating film.

37. The method of claim 29, further comprising:

before forming the mold insulating film, forming an etch stop film which exposes portions of the contact plugs.

38. A method of fabricating a semiconductor memory device, the method comprising:

forming an interlayer insulating film over a semiconductor substrate in which a cell region and a peripheral region are defined, the interlayer insulating film comprising a plurality of contact plugs located over the cell region of the semiconductor substrate;

forming an etch stop film over the interlayer insulating film, the etch stop film exposing at least portions of the contact plugs;

forming a mold insulating film over the etch stop film, the mold insulating film comprising a plurality of storage node electrode holes which expose at least portions of the contact plugs, respectively;

forming a plurality of storage node electrodes on inner surfaces of the storage node electrode holes, respectively, the storage node electrodes being spaced apart from each other and electrically connected to the respective contact plugs;

etching the mold insulating film to a depth which exposes portions of sidewalls of the storage node electrodes protruding above the etched mold insulating film;

forming a capping film which covers the storage node electrodes and a first portion of the etched mold insulating film located over the cell region of the semiconductor substrate, and which exposes a second portion of the etched mold insulating film located over the peripheral region of the semiconductor substrate;

forming a plurality of contact holes which penetrate the capping film and at least an upper part of the first portion of the mold insulating film, and which are located between at least some of the storage node electrodes;

selectively removing, including wet etching, the mold insulating film having the contact holes formed therein to expose a sidewall of at least one storage node electrode among the storage node electrodes covered by the capping film; and removing the capping film by dry etching to expose upper portions of the storage node electrodes.

* * * * *